(12) United States Patent
Groening et al.

(10) Patent No.: US 9,000,580 B2
(45) Date of Patent: Apr. 7, 2015

(54) POWER SEMICONDUCTOR MODULE WITH PRESSED BASEPLATE AND METHOD FOR PRODUCING A POWER SEMICONDUCTOR MODULE WITH PRESSED BASEPLATE

(71) Applicant: Infineon Technologies AG, Neubiberg (DE)

(72) Inventors: Torsten Groening, Paderborn (DE); Mark Essert, Lippstadt (DE); Christian Steininger, Soest (DE); Roman Lennart Tschirbs, Soest (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/749,884

(22) Filed: Jan. 25, 2013

(65) Prior Publication Data
US 2013/0193591 A1    Aug. 1, 2013

(30) Foreign Application Priority Data
Jan. 27, 2012   (DE) .............................. 102012201172

(51) Int. Cl.
| | |
|---|---|
| *H01L 29/24* | (2006.01) |
| *H01L 23/40* | (2006.01) |
| *H01L 21/50* | (2006.01) |
| *H01L 23/36* | (2006.01) |
| *H01L 23/373* | (2006.01) |
| *H01L 21/48* | (2006.01) |
| *H01L 23/31* | (2006.01) |

(52) U.S. Cl.
CPC ................ *H01L 23/40* (2013.01); *H01L 21/50* (2013.01); *H01L 23/36* (2013.01); *H01L 23/3735* (2013.01); *H01L 21/4878* (2013.01); *H01L 23/3121* (2013.01); *H01L 2924/0002* (2013.01)

(58) Field of Classification Search
CPC ........................................................ H01L 23/40
USPC .................................................. 257/717–727
See application file for complete search history.

(56) References Cited

U.S. PATENT DOCUMENTS

| | | | | |
|---|---|---|---|---|
| 5,629,562 A | * | 5/1997 | Nomura et al. ................ | 257/717 |
| 2013/0087813 A1 | * | 4/2013 | Yan et al. ........................ | 257/88 |

FOREIGN PATENT DOCUMENTS

| | | |
|---|---|---|
| DE | 19707514 A1 | 8/1998 |
| DE | 10337640 A1 | 3/2005 |
| DE | 102006011995 B3 | 11/2007 |

* cited by examiner

*Primary Examiner* — Roy Potter
*Assistant Examiner* — Paul Patton
(74) *Attorney, Agent, or Firm* — Murphy, Bilak & Homiller, PLLC

(57) ABSTRACT

A power semiconductor module includes a baseplate having a top side, an underside, and a depression formed in the baseplate. The depression extends into the baseplate proceeding from the top side. A thickness of the baseplate is locally reduced in a region of the depression. The power semiconductor module further includes a circuit carrier arranged above the depression on the top side of the baseplate such that the depression is interposed between the circuit carrier and the underside of the baseplate.

22 Claims, 5 Drawing Sheets

POWER SEMICONDUCTOR MODULE WITH PRESSED BASEPLATE AND METHOD FOR PRODUCING A POWER SEMICONDUCTOR MODULE WITH PRESSED BASEPLATE

PRIORITY CLAIM

This application claims priority to German Patent Application No. 10 2012 201 172.2, filed on 27 Jan. 2012, the content of said German application incorporated herein by reference in its entirety.

TECHNICAL FIELD

The present invention relates to power semiconductor modules having a baseplate.

BACKGROUND

Power semiconductor modules with a baseplate typically have one or more circuit carriers arranged on a top side of the baseplate. The circuit carriers are populated with one or more electronic components to be cooled, wherein the waste heat arising in the components during the operation of the power semiconductor module is dissipated via the circuit carriers and the baseplate toward a heat sink by means of the module being pressed by the underside of the baseplate against the heat sink. Optionally, a heat transfer medium such as a thermally conductive paste, for example, can be introduced between the heat sink and the baseplate.

In order to achieve cooling of the components that is as effective as possible, a small distance between the baseplate and the heat sink is desirable in principle. Since the circuit carriers are usually cohesively connected to the baseplate and, if appropriate, cohesively connected to further components, flexures of the arrangement occur during the operation of the power semiconductor module on account of different coefficients of thermal expansion of the elements connected to one another, as a result of which flexures the distance between the baseplate and the heat sink can vary locally.

Moreover, during the mounting of the module on the heat sink, for example with the aid of fixing screws or other fixing elements, local stresses can occur which have the effect that the distance between baseplate and heat sink increases in regions which are somewhat further away from the relevant fixing locations.

If such thermally dictated flexures or mounting-dictated increases in distance occur below the circuit carriers, then this has the effect that the thermal transfer resistance between baseplate and heat sink increases significantly precisely in the regions having particularly high evolution of heat.

SUMMARY

According to embodiments described herein, a power semiconductor module is provided which, if mounted on a heat sink, can be operated with a low thermal resistance between the baseplate and the heat sink particularly in the region of the circuit carriers. A method for producing such a power semiconductor module is also described herein.

According to an embodiment of a power semiconductor module, the module comprises a baseplate and a circuit carrier. The baseplate has a top side, an underside, and a depression formed in the baseplate. The depression extends into the baseplate proceeding from the top side. A thickness of the baseplate is locally reduced in the region of the depression. The circuit carrier is arranged above the depression on the top side of the baseplate such that the depression is interposed between the circuit carrier and the underside of the baseplate. On account of the depression below the circuit carrier, the baseplate is stabilized in this region with respect to flexures such as can occur during mounting and/or during operation of the module. As a result, it is possible to achieve a very small distance and in association therewith a low thermal transfer resistance between the baseplate and a heat sink coupled thereto below the circuit carriers.

To produce such a power semiconductor module, a plate, for example composed of metal, is provided, which has a top side and an underside opposite the top side. A pressing step is then carried out, wherein one or more depressions are formed in the plate, each of the depressions extending into the plate proceeding from the top side. In addition—before or after the pressing step—a bending step is carried out, wherein the plate is provided with a curvature. Furthermore, a circuit carrier is provided, arranged above the depression on the top side and connected to the baseplate such that the depression is interposed between the circuit carrier and the underside of the baseplate.

Those skilled in the art will recognize additional features and advantages upon reading the following detailed description, and upon viewing the accompanying drawings.

BRIEF DESCRIPTION OF THE DRAWINGS

The invention is explained in greater detail below based on exemplary embodiments with reference to the accompanying figures. In the figures, identical reference signs designate identical or mutually corresponding elements having an identical or mutually corresponding function. In the figures.

DETAILED DESCRIPTION

Figure 1A:
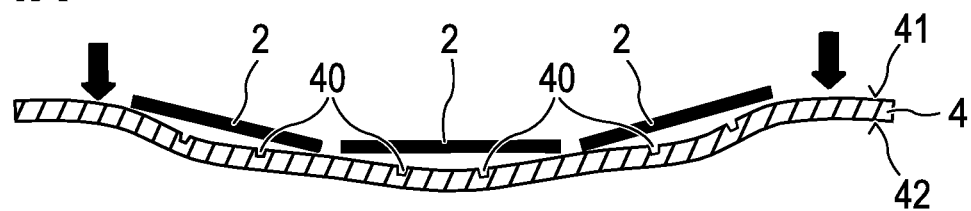
FIG. 1A shows a vertical section through a baseplate populated with circuit carriers.

FIG. 1A shows a vertical section through a baseplate 4 having a top side 41 and an underside 42 opposite the top side 41. The top side 41 and the underside 42 are given by the sides of the baseplate 4 which have the largest areas. Proceeding from the top side 41, a plurality of depressions 40 extend into the baseplate 4, the thickness of the baseplate 4 in each case being locally reduced in the region of the depressions 40. Furthermore, by way of example, three circuit carriers 2 are arranged on the top side 41, at least one of the depressions 40 being situated below each of the circuit carriers 2.

Figure 2A:
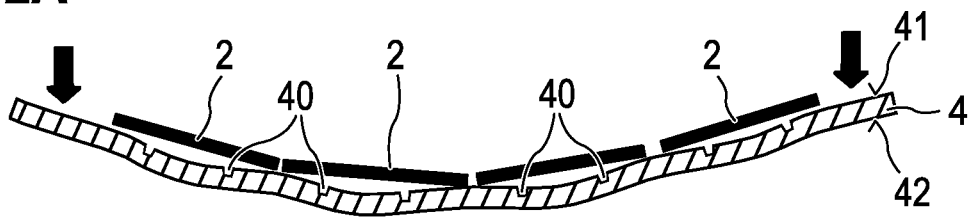
FIG. 2A shows a vertical section through a further baseplate populated with circuit carriers.

In the case of the illustration in accordance with FIG. 1A and also the subsequent FIG. 2A, it is pointed out that they are merely schematic illustrations showing the position of the depressions 40 relative to the baseplate 4 and the circuit carriers 2. In this case, the fact that the circuit carriers 2 are cohesively connected to the top side 41 of the baseplate 4 by means of a connecting means arranged between each of the circuit carriers 2 and the baseplate 4 is not illustrated. The inner structure of the circuit carriers 2 and population of the circuit carriers 2 on their sides facing away from the baseplate 4 are likewise not illustrated. Furthermore, it is pointed out that the flexure of the baseplate 4 is illustrated in an exaggerated fashion. In real arrangements, the flexures are significantly less pronounced, that is the baseplate 4 appears as a substantially planar plate.

Figure 1B:
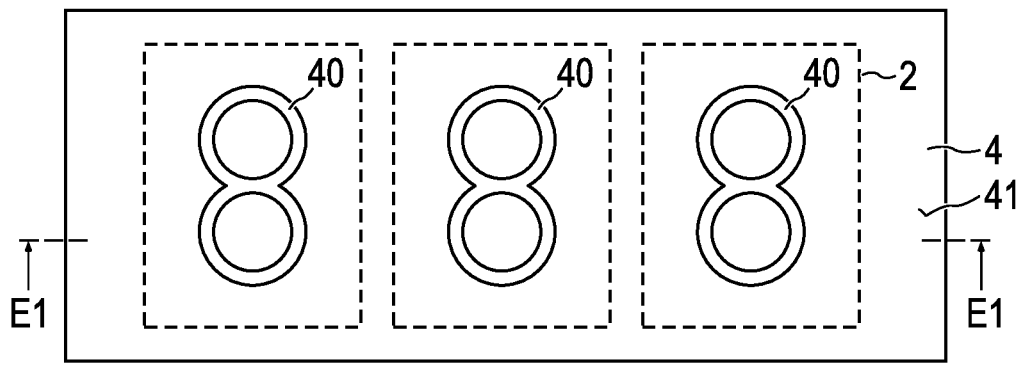
FIG. 1B shows a plan view of the arrangement in accordance with FIG. 1A with the circuit carriers removed.

In the plan view of the top side 41 in accordance with FIG. 1B, the circuit carriers 2 have been removed, such that the depressions 40 situated below the circuit carriers 2 are discernible. In order to clarify the positions of the depressions 40 relative to the circuit carriers 2, just the lateral boundary lines of the circuit carriers 2 are illustrated by dashed lines. The sectional plane E1-E1 of the sectional view in accordance with FIG. 1A is additionally identified in FIG. 1B.

While the baseplate according to FIG. 1A is populated by way of example with three circuit carriers 2, four circuit carriers 2 are provided in the case of the arrangement in accordance with FIG. 2A. In principle, the number of circuit carriers 2 arranged jointly on the top side 41 of the baseplate 4 is arbitrary, that is to say that exactly one circuit carrier 2 can be provided, but also two, three, four or more circuit carriers 2 independent of one another. Optionally, all circuit carriers 2 arranged on the top side 41 can be arranged one behind another in a row, as can be discerned in FIGS. 1B and 2B. However, a plurality of circuit carriers 2 can e.g. also be arranged in a matrix-like manner in rows and columns on the top side 41, for example concomitantly in two or more rows and two or more columns.

Figure 2B:
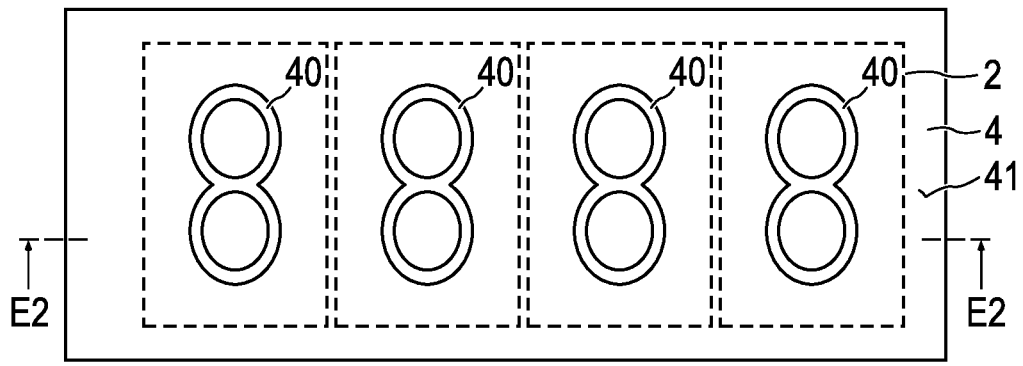
FIG. 2B shows a plan view of the arrangement in accordance with FIG. 2A with the circuit carriers removed.

FIG. 2B shows the plan view of the top side 41 of the baseplate 4 in accordance with FIG. 2A, wherein once again the circuit carriers 2 have been removed and their positions identified by their lateral boundary lines in a dashed manner. The sectional plane E2-E2 of the sectional view in accordance with FIG. 2A is likewise depicted.

The baseplate 4 can comprise for example copper, or a copper alloy. In the case of a copper alloy, the copper proportion can be chosen arbitrarily.

Moreover, the baseplate 4, independently of its material, can be provided with a coating with one or more layers at least on its top side 41, for example if the production of a cohesive connection between the top side 41 of the baseplate 4 and a circuit carrier 2 is intended to be facilitated. Such a cohesive connection can be a soldering connection, for example, by which the underside of the relevant circuit carrier 2 is soldered to the top side 41 of the baseplate 4 by means of a solder. In order to improve the solderability of the baseplate 4, the baseplate 4 can be provided with a particularly readily-solderable coating, e.g. comprising or composed of nickel, at least in the region of the provided soldering location on its top side 41.

A further possibility for producing a cohesive connection between a circuit carrier 2 and a baseplate 4 can include a sintering connection, for the production of which a paste containing a noble metal powder and a solvent is introduced between the relevant circuit carrier 2 and the top side 41, dried and subsequently sintered. In order to improve the sintering capability, the baseplate 4 can be provided with a noble metal coating at least in the region of the provided sintering location on its top side 41. Suitable noble metals include, for example, silver or gold.

Figure 3A:
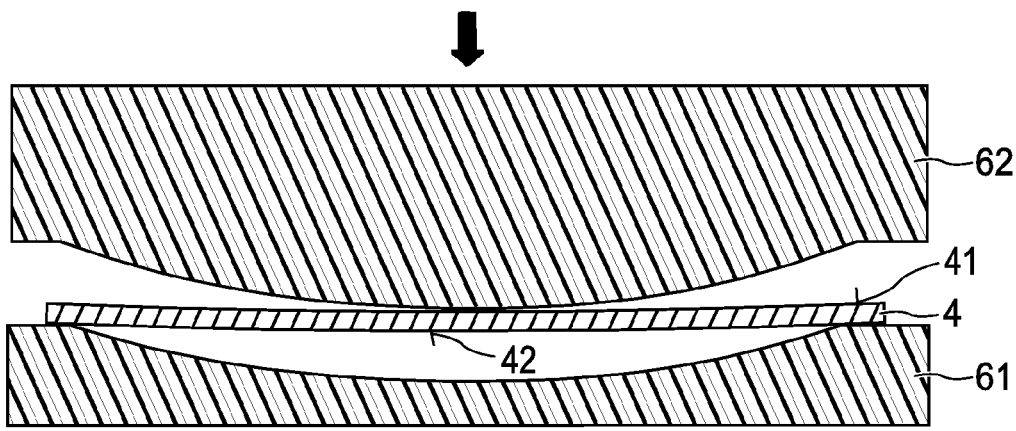
FIGS. 3A-3C show different steps of a method for producing a baseplate.

In order to produce a composite between one or more circuit carriers 2 and a baseplate 4, it is firstly necessary to produce a suitably preshaped baseplate 4. For this purpose, two methods are explained below. In accordance with a first method, explained with reference to FIGS. 3A to 3C, firstly the still planar baseplate 4 is provided and is subsequently reshaped to form a baseplate 4.

In principle, the top side 41 and/or the underside 42 of a baseplate 4 can optionally have in each case one or more turning points at which the direction of curvature of the relevant side 41 and/or 42 changes.

Figure 3B:
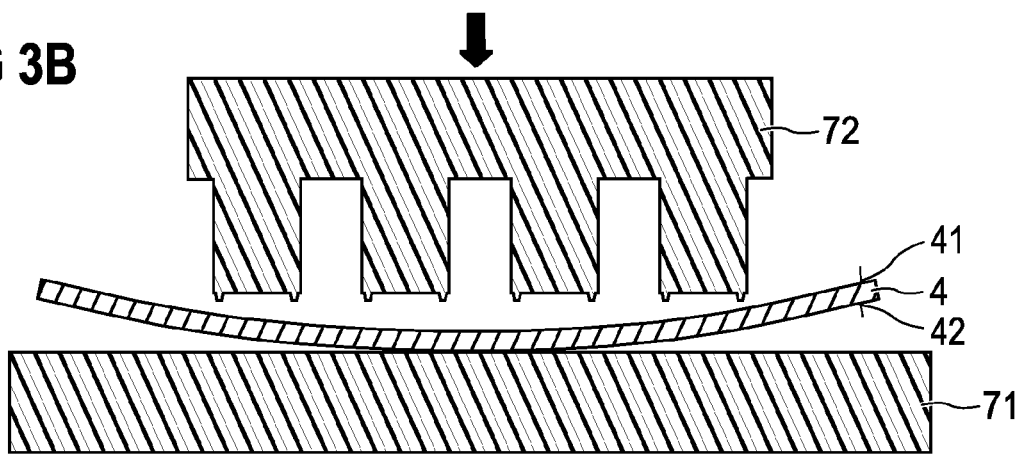
Figure 3C:
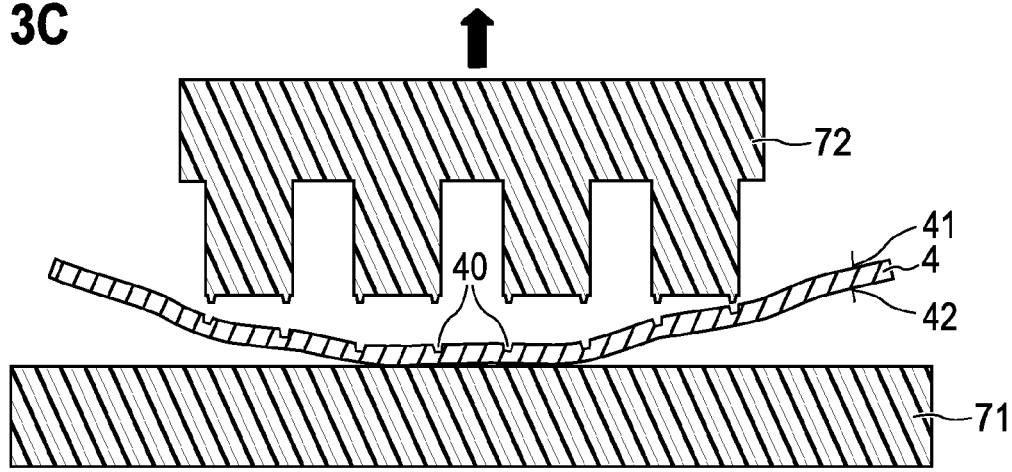

The initially substantially planar baseplate 4 is provided with a precurvature by means of a bending tool 61, 62 in such a way that the later underside 42 is convexly prebent, as is shown by way of example in FIG. 3B. In this illustration, the baseplate 4 is directly before a pressing step which follows the bending step in accordance with FIG. 3A and by which the baseplate 4, by means of a pressing tool 71, 72, is provided with depressions 40, as shown as the result in FIG. 3C. The arrows illustrated in FIGS. 3A to 3C in each case indicate the direction of movement of the upper tool 62 and 72 relative to the associated lower tool 61 and 71, respectively.

At the end of the bending process, the baseplate 4 acquires an internal prestress, which it also retains at least partly after the subsequent pressing step. As a result, the baseplate 4 still has a convex curvature at its underside 42 also after the conclusion of the pressing step.

Figure 4A:
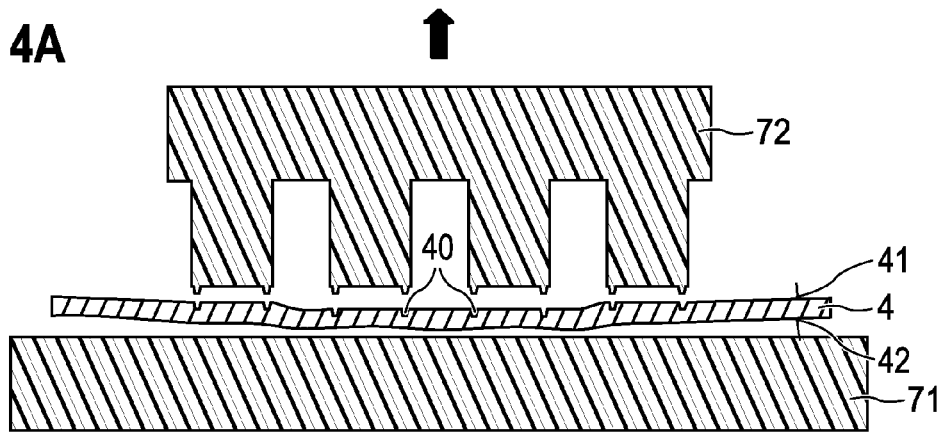
FIGS. 4A-4C show different steps of a further method for producing a baseplate.

In another method, explained with reference to FIGS. 4A to 4C, the baseplate 4 is firstly provided with depressions 40 at its top side 41 using a pressing tool 71, 72, the depressions 40 extending into the baseplate 4 proceeding from the top side 41. FIG. 4A shows the baseplate 4 after the pressing step and after the upper tool 72 has been lifted off.

Figure 4B:
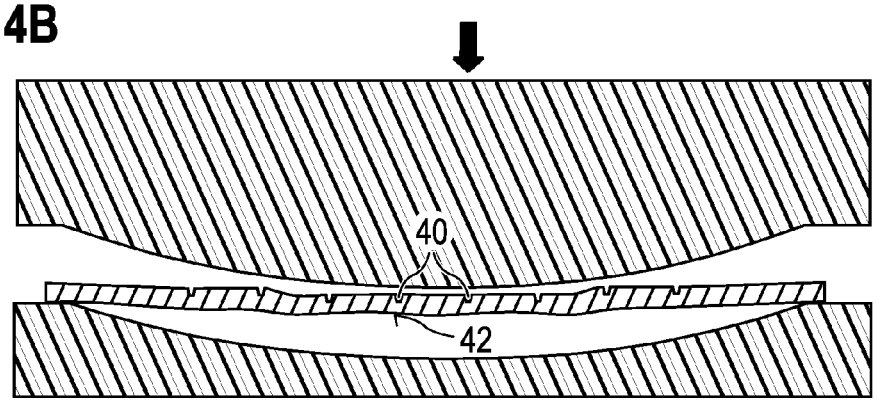
Figure 4C:
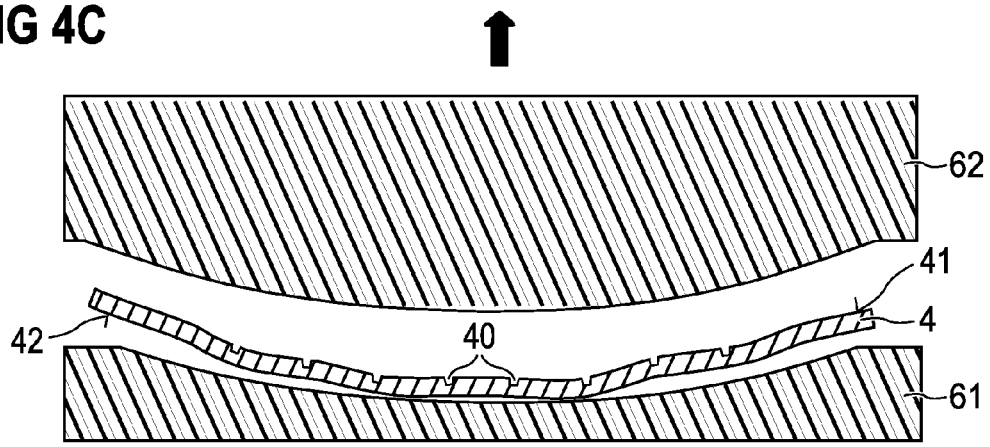

Afterward, as is shown in FIGS. 4B and 4C, the baseplate 4 is bent in a bending step in such a way that its underside 42 has a convex curvature. A baseplate 4 such as is illustrated in FIG. 4C is present as a result.

Figure 5:
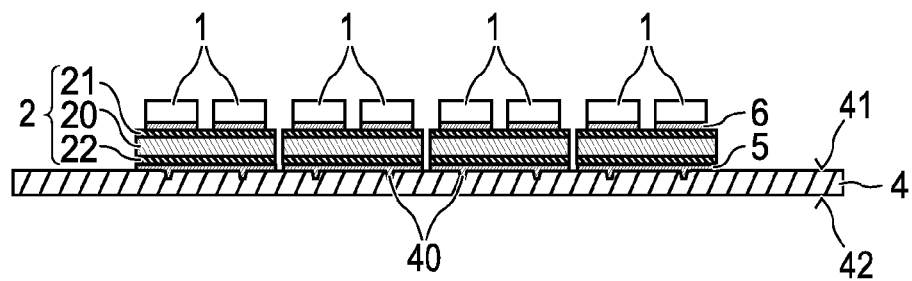
FIG. 5 shows a vertical section through a baseplate populated with a plurality of circuit carriers, each of which is populated with one or more semiconductor components.

A baseplate 4 produced based on one of the methods explained in FIGS. 3A to 3C or FIGS. 4A to 4C can then be populated with one or more circuit carriers 2. One example of this is shown in FIG. 5. FIG. 5 illustrates the baseplate 4—apart from the depressions 40—as a substantially planar plate. In actual fact, the underside 42 of the baseplate 4 has a very small convex precurvature.

Each of the circuit carriers 2 has a dielectric carrier 20, which can be a ceramic lamina, for example. Suitable ceramic materials include, for example, aluminum oxide ($Al_2O_3$), silicon nitride (SiN), aluminum nitride (AlN), or zirconium oxide ($ZrO_2$). The insulation carrier 20 of each of the circuit carriers 2 is provided with an upper metallization 21 at its top side facing away from the baseplate 4, the upper metallization 21 being structured to form conductor tracks and/or conductor areas. Optionally, each of the circuit carriers 2 can be provided with a lower metallization 22 on its underside facing the baseplate 4, which lower metallization 22 can be embodied as an uninterrupted, closed metal layer.

The lower metallization 22 can be used, in particular, for cohesively connecting the relevant circuit carrier 2 to the top side 41 of the baseplate 4. For this purpose, a connecting means 5 is provided, which is arranged between the relevant circuit carrier 2 and the top side 41. The connecting means 5 can be, for example, a solder layer, a sintering layer or an adhesive layer. In this case, the connecting means 5 can completely fill the depression 40 at least at one location. That is to say that at this location the connecting means 5 extends, relative to the top side 41 of the baseplate 4, from the deepest location of the depression 40 as far as the level of the top side 41.

Furthermore, each of the circuit carriers 2 can be populated, on its top side facing away from the baseplate 4, with one or more semiconductor chips 1 which are electrically conductively connected to the upper metallization 21 of the relevant circuit carrier 2 with the aid of a further connecting means 6. The relevant connecting means 6 serves for mechanically fixing the respective semiconductor chip 1 to the relevant circuit carrier 2. However, the further connecting means 6 can optionally also be used to produce an electrically conductive connection between the respective semiconductor chip 1 and the upper metallization 21 of the associated circuit carrier 2. In the latter case, the upper metallization 21 can also be used to electrically interconnect the semiconductor chip 1 with other semiconductor chips 1 and/or further components (not illustrated in FIG. 5). In principle, arbitrary semiconductor chips such as, for example, MOSFETs, IGBTs, JFETs, diodes, thyristors, etc. can be used as semiconductor chips 1.

Figure 6:
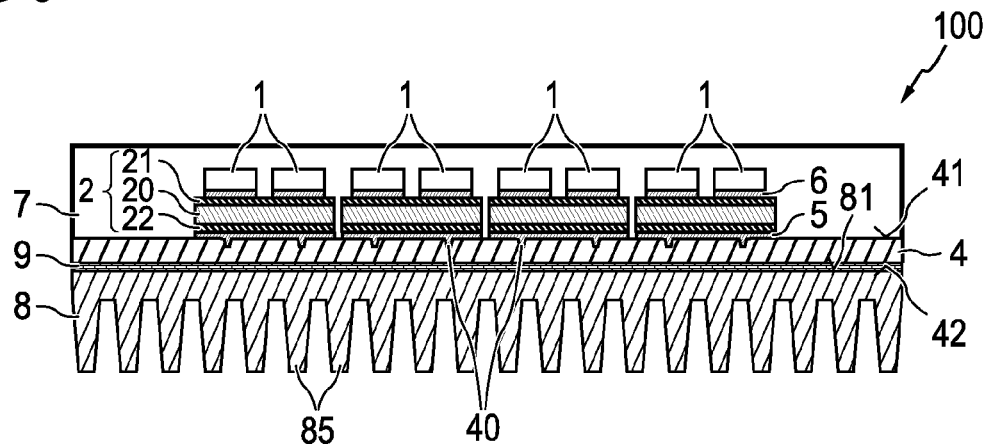
FIG. 6 shows the arrangement in accordance with FIG. 5 provided with a housing and mounted on a heat sink.

During further production the power semiconductor module 100 can be provided with a housing 7 and then brought into thermal contact with a heat sink 8, which is shown by way of example in FIG. 6. For this purpose, the power semiconductor module 100 is pressed by the underside 42 of the baseplate 4 against a thermal contact area 81 of the heat sink 8. The thermal contact area 81 is preferably a planar surface portion of the heat sink 8.

Optionally, a thermally conductive medium 9, for example a thermally conductive paste, can also be introduced between the baseplate underside 42 and the heat sink thermal contact area 81. In order to produce the contact pressure between the power semiconductor module 100 and the heat sink 8, the baseplate 4 can be provided with through-openings (not shown in FIG. 6), with the aid of which the power semiconductor module 100 can be screwed to the heat sink 8. Instead of or in addition to screwing, it is possible to provide a clamping device having one or more clamping elements, with the aid of which the power semiconductor module 100 is clamped to the heat sink 8, such that a contact pressure arises between these two.

Optionally, the heat sink 8 can be provided with a plurality of cooling ribs 85 on its side facing away from the thermal contact area 81. Instead of or in addition to cooling ribs, the heat sink 8 can also be embodied as a liquid-cooling heat sink and have cooling channels through which a cooling fluid, for example water or a cooling gas, is conducted.

Figure 7:
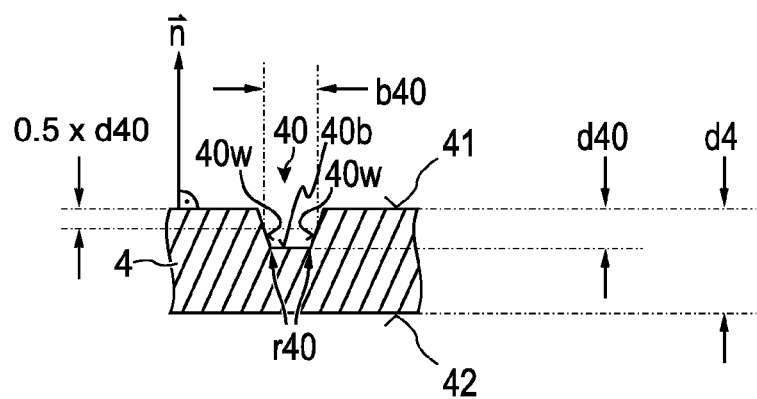
FIG. 7 shows a vertical section through a portion of a baseplate in the region of a depression.

FIG. 7 shows a vertical section through an enlarged view of a depression 40 such as can be used in the present invention. The depression 40 was produced by pressing the baseplate 4. The depression 40 has, relative to the substantially planar top side 41 of the baseplate 4, a depth $d40$. The baseplate 4 has a thickness $d4$. The thickness $d4$ and the depth $d40$ are measured outside the depression 40 in a normal direction n relative to the top side 41 of the baseplate 4. At half its depth $d40$, the depression 40 has a width $b40$. The thickness $d4$ of the baseplate 4 can be in the range of 2 mm to 10 mm for example. Optionally, the depth $d40$ can be 5% to 95% of the thickness $d4$ of the baseplate 4. In accordance with a further option, the width $b40$ of the depression 40, likewise independently of the abovementioned values, can be chosen to be greater than its depth $d40$.

Furthermore, the surface of the baseplate 4 within a depression 40 can have a radius $r40$ of curvature which is less than the thickness $d4$ of the baseplate 4. In this case, "surface of the baseplate 4 within a depression 40" is considered to be the side walls $40w$ and the base $40b$ of the depression 40.

Figure 8:
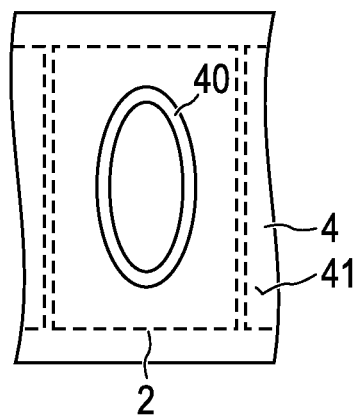
FIG. 8 shows a plan view of the top side of a baseplate provided with a ring-shaped depression.

The course of one or more depressions 40 arranged wholly or partly below a circuit carrier 2 can be chosen arbitrarily in principle, which will be explained by way of example with reference to the subsequent FIGS. 8 to 11. The depression 40 in accordance with FIG. 8 is formed e.g. by a trench closed in a ring-shaped manner. The course closed in a ring-shaped manner prevents local stress peaks that could otherwise occur at an end of the trench. A depression 40 embodied as a trench closed in a ring-shaped manner can have, for example, an annular course, an oval course, an elliptical course, but also some other regular or irregular course such as e.g. that of a figure eight, as shown by way of example in FIGS. 1B and 2B.

Figure 9:
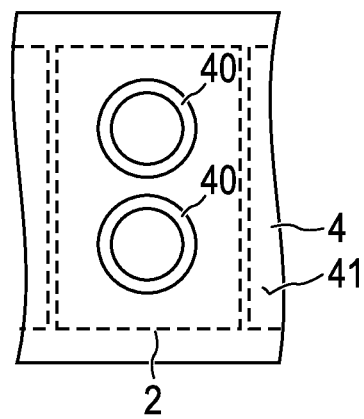
FIG. 9 shows a plan view of the top side of a baseplate provided with two ring-shaped depressions.

In the case of the arrangement in accordance with FIG. 9, two depressions 40 which are independent of one another, that is to say which do not cross one another and are spaced apart from one another, are provided, each of the depressions 40 being formed by a closed trench.

Figure 10:
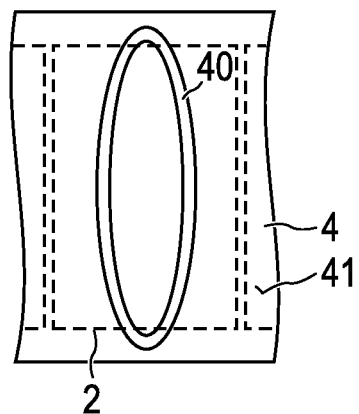
FIG. 10 shows a plan view of the top side of a baseplate provided with a ring-shaped depression, where the depression extends beyond the lateral edge of the circuit carrier.

With reference to the arrangement in accordance with FIG. 10, the intention is to illustrate that a depression 40 can extend beyond the circuit carrier 2 in a lateral direction. In this case, "lateral direction" is understood to be any direction perpendicular to a normal to the top side 41 outside the depressions 40. In the regions situated outside the lateral boundaries of the circuit carrier 2, the depression 40 need not necessarily be completely provided with a connecting means 5 (see FIGS. 5 and 6). In this case, the depression 40 can be used to take up a connecting means 5, for example a solder, which connecting means is displaced laterally during the production of the connection between the relevant circuit carrier 2 and the baseplate 4, and thereby to produce a thin connecting layer 5 having a thermally low transfer resistance. In the case of the example in accordance with FIG. 10, therefore, the depression 40 is not completely covered by the circuit carrier 2, but rather only partly covered by the circuit carrier 2 and is therefore also not arranged completely between the circuit carrier 2 and the top side 41.

Figure 11:
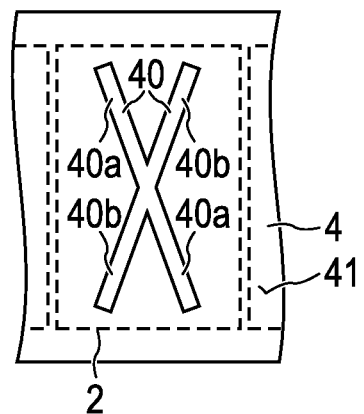
FIG. 11 shows a plan view of the top side of a baseplate provided with a depression having portions that cross one another.

In the case of the arrangement in accordance with FIG. 11, the depression 40 has two trenches $40a$ and $40b$ which cross one another.

The invention has been explained above on the basis of various embodiments. It is pointed out that the features disclosed in the various embodiments can be combined with one another in an arbitrary way as long as a combination of specific features is not precluded for technical reasons.

What is claimed is:

1. A power semiconductor module, comprising:
 a baseplate having a top side, an underside, and a depression formed in the baseplate, the depression extending into the baseplate proceeding from the top side, a thickness of the baseplate being locally reduced in a region of the depression; and
 a circuit carrier arranged above the depression on the top side of the baseplate such that the depression is interposed between the circuit carrier and the underside of the baseplate, the circuit carrier comprising a substrate including a dielectric ceramic lamina provided with an upper metallization on a side facing away from the baseplate and a lower metallization on a side facing the baseplate, the lower metallization being electrically insulated from the upper metallization.

2. The power semiconductor module as claimed in claim 1, wherein the baseplate has a thickness of 2 mm to 10 mm.

3. The power semiconductor module as claimed in claim 2, wherein the depression has a depth between 5% and 95% of the thickness of the baseplate.

4. The power semiconductor module as claimed in claim 1, wherein the circuit carrier is connected by a cohesive connection to the top side of the baseplate using a connecting means arranged between the circuit carrier and the baseplate.

5. The power semiconductor module as claimed in claim 4, wherein the cohesive connection is a soldered connection, a sintered connection, or an adhesive-bonded connection.

6. The power semiconductor module as claimed in claim 4, wherein the connecting means extends into the depression and completely fills the depression at least at one location completely from a deepest point of the depression as far as the top side of the baseplate.

7. The power semiconductor module as claimed in claim 1, wherein a width of the depression measured at half a depth of the depression is greater than the depth.

8. The power semiconductor module as claimed in claim 1, wherein the depression has a width greater than a depth of the depression.

9. The power semiconductor module as claimed in claim 1, wherein a surface of the baseplate within the depression has a radius of curvature less than the thickness of the baseplate.

10. The power semiconductor module as claimed in claim 1, further comprising a heat sink with a thermal contact area pressed against the underside of the baseplate.

11. The power semiconductor module as claimed in claim 1, wherein the circuit carrier completely covers the depression in the baseplate.

12. The power semiconductor module as claimed in claim 1, wherein the circuit carrier only partly covers the depression in the baseplate.

13. The power semiconductor module as claimed in claim 1, wherein the depression in the baseplate comprises a trench closed in a ring-shaped manner.

14. The power semiconductor module as claimed in claim 13, wherein the trench has one of an annular course, an oval course, or an elliptical course.

15. The power semiconductor module as claimed in claim 1, wherein the depression in the baseplate comprises two trenches which cross one another.

16. A method for producing a power semiconductor module, the method comprising:
providing a plate having a top side and an underside opposite the top side;
forming one or more depressions in the plate, each of the depressions extending into the plate proceeding from the top side so that a thickness of the plate is locally reduced in a region of the depressions;
bending the plate so that the plate is provided with a curvature;
arranging a circuit carrier above the depressions on the top side of the plate; and
connecting the circuit carrier to the plate such that the depressions are interposed between the circuit carrier and the underside of the plate.

17. The method as claimed in claim 16, wherein the plate is bent after the depressions are formed in the plate.

18. The method as claimed in claim 16, wherein the plate is bent before the depressions are formed in the plate.

19. The method as claimed in claim 16, further comprising pressing the underside of the baseplate against a thermal contact area of a heat sink.

20. A power semiconductor module, comprising:
a baseplate having a top side, an underside, and a depression formed in the baseplate, the depression extending into the baseplate proceeding from the top side, a thickness of the baseplate being locally reduced in a region of the depression; and
a circuit carrier arranged above the depression on the top side of the baseplate such that the depression is interposed between the circuit carrier and the underside of the baseplate,
wherein the circuit carrier only partly covers the depression in the baseplate.

21. A power semiconductor module, comprising:
a baseplate having a top side, an underside, and a depression formed in the baseplate, the depression extending into the baseplate proceeding from the top side, a thickness of the baseplate being locally reduced in a region of the depression; and
a circuit carrier arranged above the depression on the top side of the baseplate such that the depression is interposed between the circuit carrier and the underside of the baseplate,
wherein the depression in the baseplate comprises a trench closed in a ring-shaped manner.

22. A power semiconductor module, comprising:
a baseplate having a top side, an underside, and a depression formed in the baseplate, the depression extending into the baseplate proceeding from the top side, a thickness of the baseplate being locally reduced in a region of the depression; and
a circuit carrier arranged above the depression on the top side of the baseplate such that the depression is interposed between the circuit carrier and the underside of the baseplate,
wherein the depression in the baseplate comprises two trenches which cross one another.

* * * * *